United States Patent
Ma et al.

(10) Patent No.: US 9,295,167 B2
(45) Date of Patent: Mar. 22, 2016

(54) METHOD TO PREWET WAFER SURFACE

(71) Applicant: ACM Research (Shanghai) Inc., Shangahi (CN)

(72) Inventors: Yue Ma, Shanghai (CN); David Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 0 days.

(21) Appl. No.: 14/077,756

(22) Filed: Nov. 12, 2013

(65) Prior Publication Data

US 2014/0154405 A1  Jun. 5, 2014

Related U.S. Application Data

(63) Continuation-in-part of application No. 12/005,538, filed on Dec. 27, 2007, which is a continuation of application No. PCT/CN2007/070980, filed on Oct. 30, 2007.

(51) Int. Cl.

| | |
|---|---|
| *B05D 5/12* | (2006.01) |
| *H05K 3/46* | (2006.01) |
| *C23C 16/02* | (2006.01) |
| *C23C 14/02* | (2006.01) |
| *C25D 5/02* | (2006.01) |
| *H01L 21/288* | (2006.01) |
| *C25D 5/54* | (2006.01) |

(Continued)

(52) U.S. Cl.
CPC ............ *H05K 3/4661* (2013.01); *C23C 14/021* (2013.01); *C23C 16/0227* (2013.01); *C25D 5/02* (2013.01); *C25D 5/54* (2013.01); *H01L 21/2885* (2013.01); *H01L 21/76877* (2013.01); *H05K 3/4644* (2013.01); *C23C 14/024* (2013.01); *C23C 14/046* (2013.01); *C23C 16/0272* (2013.01)

(58) Field of Classification Search
USPC .................................. 427/99.5, 96.8
See application file for complete search history.

(56) References Cited

U.S. PATENT DOCUMENTS

| | | |
|---|---|---|
| 3,874,897 A | 4/1975 | Fadgen, Jr. et al. |
| 6,045,864 A | 4/2000 | Lyons et al. |

(Continued)

FOREIGN PATENT DOCUMENTS

JP  11-097391 A  4/1999

OTHER PUBLICATIONS

International Search Report issued in corresponding International Application No. PCT/CN2007/070980.

(Continued)

*Primary Examiner* — Brian K Talbot
(74) *Attorney, Agent, or Firm* — Osha Liang LLP (57) ABSTRACT

The present invention improves the wetting between process solution and the wafer surface when they are put into contact by pre-implementing an adsorbed liquid layer on the entire front surface of the wafer just prior to the process. The pre-implementing adsorbed liquid layer is realized by transporting vaporized liquid molecules from vapor phase at elevated temperature (relative to wafer) and condensing them onto wafer surface. The pre-implementing adsorbed liquid is fully filled in the patterned structures formed on the wafer by multilayer absorption of the vaporized liquid molecules and the temperature of the wafer surface is above dew point of the vaporized liquid while condensing, which avoids generating bubbles inside the patterned structures.

8 Claims, 6 Drawing Sheets

(51) Int. Cl.
    *H01L 21/768*    (2006.01)
    *C23C 14/04*     (2006.01)

(56) References Cited

U.S. PATENT DOCUMENTS

| | | |
|---|---|---|
| 6,159,662 A | 12/2000 | Chen et al. |
| 6,286,231 B1 * | 9/2001 | Bergman et al. ............... 34/410 |
| 6,492,268 B1 | 12/2002 | Pyo |
| 6,544,585 B1 | 4/2003 | Kuriyama et al. |
| 6,559,072 B2 | 5/2003 | Davlin et al. |
| 6,753,237 B1 * | 6/2004 | Chen ............................ 438/424 |
| 6,776,893 B1 | 8/2004 | Too et al. |
| 6,864,187 B2 | 3/2005 | Tomimori et al. |
| 6,875,260 B2 | 4/2005 | Verbunt |
| 6,884,720 B1 | 4/2005 | Lu et al. |
| 6,936,114 B1 | 8/2005 | Zuck et al. |
| 6,946,399 B1 * | 9/2005 | Lorimer ....................... 438/704 |
| 7,146,994 B2 | 12/2006 | Breiling et al. |
| 7,223,323 B2 | 5/2007 | Yang et al. |
| 8,450,210 B1 * | 5/2013 | Patton et al. .................. 438/675 |
| 2002/0119655 A1 * | 8/2002 | Liu ............................... 438/668 |
| 2004/0069644 A1 | 4/2004 | Nelsen et al. |
| 2004/0234696 A1 | 11/2004 | Hongo et al. |
| 2005/0236018 A1 | 10/2005 | Nagami |
| 2006/0223312 A1 | 10/2006 | Yonker et al. |

OTHER PUBLICATIONS

Office Action from Singaporean Application No. 2010030708/11060 issued on Jun. 1, 2011.
Office Action from Taiwanese Application issued on Jun. 15, 2011.
Notice of Office Action issued by the Korean Intellectual Property Office (KIPO) in corresponding Korean Patent Application No. 10-2010-7011970, with English translation (10 pages).

* cited by examiner

METHOD TO PREWET WAFER SURFACE

CROSS-REFERENCE TO RELATED APPLICATIONS

The present application is a continuation-in-part of U.S. patent application Ser. No. 12/005,538, filed Dec. 27, 2007, which is a continuation of International Application No. PCT/CN2007/070980, filed Oct. 30, 2007, all of which are incorporated herein by reference.

BACKGROUND OF THE INVENTION

The present invention relates to wafer surface wetting for metallization, more particularly, relates to pre-wetting wafer surfaces.

Advanced interconnections of ultra large scale integrated (ULSI) circuits are fabricated in part by electrochemically or chemically (also known as "electrolessly") depositing metallic materials, typically copper, onto wafer surface from one or more electrolyte solutions. The deposition process, beginning with a dry wafer immersing into an electrolyte bath, or with sprays of an electrolyte solution onto a dry wafer, may encounter several problems. One severe problem is the incomplete wetting of electrolyte on the wafer surface to be deposited, for that no deposition occurs in areas where electrolyte is not in contact with the wafer surface. The wetting related defects formed by this mechanism, often manifest as pits on deposited films and large voids or miss-filled segments in vias and trenches, are known to cause appreciable number of unit devices useless.

The incomplete wetting between electrolyte and the wafer is a surface phenomenon and can be results of many process parameters that affect the surface properties of the electrolyte and the wafer. To name a few, the compatibility between the wafer surface and the electrolyte that contain various types of the organic additives, the environment the wafer is exposed to prior to electroplating or electroless plating, the age of the plating electrolyte, the queue time between the current deposition step and the previous step, which is either implementing a thin metal layer or polishing to expose both metal and dielectric partitions, in the process flow. The queue time is especially important because oxidation of wafer surface during this time significantly changes the surface properties of the wafer.

One method to improve wetting for electroplating of copper is to implement a pre-wetting station on an electrochemical deposition equipment, as disclosed by US 2004/0069644, and US 2007/7223323. According to this method, a wafer is first wetted in a spin-rinse-dry (SRD) module with de-ionized wafer (DIW). A combination of spin RPM and DIW flow rates is required to improve water coverage on the wafer surface. After pre-wetting, the wafer surface is presumably to carry a thin layer of wafer when it immerses into a plating electrolyte solution. Adding pre-wetting stations to an integrated processing tool increases the overall footprint and requires lager clean room space for such an equipment to be installed.

Another method to create such a pre-wetting layer is to use an in-situ DIW rinse nozzle within the plating process module. According to this method, DIW is injected onto wafer surface while it is held on a spinning wafer chucking device facing to the plating electrolyte solution. Centrifugal force keeps DIW on the spinning wafer surface from falling into the electrolyte solution. US 2006/7146994 has disclosed such a method. This method does not require additional space, thereby the overall tool footprint unchanged; however, it is less robust as a small misalignment of DIW nozzle can lead to DIW being injected into electrolyte solution.

Both methods have three inherent problems: (1) the layer of water that each wafer carries into the electrolyte solution causes global dilution of plating bath in a high volume factory, thereby altering the pre-set process conditions, (2) the layer of water that a wafer carries into the electrolyte solution causes local dilution near the wafer surface, especially in DIW-occupied via and trench features that are to be metallized, and results voids and miss-filled features after plating, and (3) longer overall process time. It is well understood that a typical SRD process leaves a layer of water of micrometers thickness on wafer surface, as the viscous resistance to wafer flow in a thin layer is too high (inversely proportional to the cube of its thickness) for it to be spun off. The thickness of the wafer layer can be reduced by allowing evaporation; however, more process time must be added and the overall equipment throughput surfers further. Consistent evaporation process for every wafer is difficult to achieve as robot movement and pick-up/drop-off priority in an integrated equipment impacts both evaporation conditions and time.

Yet another method is to modify the plating electrolyte by adding wetting enhancement agents, typically a surfactant or a group of surfactants to lower the surface tension of the electrolyte, as disclosed in US 2004/6776893. An alternation is to pre-treat wafer surface with liquid containing these wetting agents in a separate module prior to exposing the wafer to the plating electrolyte, as disclosed in U.S. Pat. No. 6,875,260. This type of methods increase the level of processing complexity and significantly adds costs for process characterization and monitoring. As the feature size continues to shrink, pre-wetting various wafer surfaces by displacing gas in nanometer scale via trench features with a viscous liquid, as in all three methods mentioned above, is ever challenging.

U.S. Pat. No. 6,544,585 discloses a method and apparatus for producing a metal deposit inside micro-cavities formed on a surface of a substrate. The method utilizes cooling the substrate to a temperature lower than a dew point of a condensable gas to form droplets thereof within the micro-cavities. When the substrate is immersed in the plating solution, the plating solution replaces the droplets and infiltrates the micro-cavities by affiliating with the droplets of the condensable gas. However, cooling the substrate to below the dew point of the condensable gas does not always produce droplets because the condensable gas may be in a supercooled state and remain in the gaseous state. For solving this problem, the method includes a step of vibrating the substrate, which complicates the method.

SUMMARY OF THE INVENTION

The present invention improves the wetting between process solution and the wafer surface when they are put into contact by pre-implementing an adsorbed liquid layer on the entire front surface of the wafer just prior to the process. The pre-implementing adsorbed liquid layer is realized by condensing liquid molecules from vapor phase at elevated temperature (relative to wafer) onto wafer surface. The pre-implementing adsorbed liquid is fully filled in the patterned structures formed on the wafer by multilayer absorption of the vaporized liquid molecules and the temperature of the wafer surface is above dew point of the vaporized liquid while condensing, which avoids generating bubbles inside the patterned structures.

Pre-wetting is completed by transporting of liquid molecules supplied by a source constantly generating its vapor, through gaseous phase, followed by condensation, instead of using a viscous liquid to displace the gas covering the front side of the wafer.

Vapor delivery onto wafer surface is done by flowing vapor through a nozzle that is either stationary or in motion relative to wafer. And vapor is generated by heating the liquid in a vessel with controlled pressure.

Vaporized liquid molecules penetrate into small features by vapor convection and diffusion, which is much quicker compared to liquid penetration that is also governed by its wetting behavior, and is independent of solid surface properties; thus the time needed to complete vapor coverage on various wafer surfaces is the same.

DETAILED DESCRIPTION

Figure 1A:
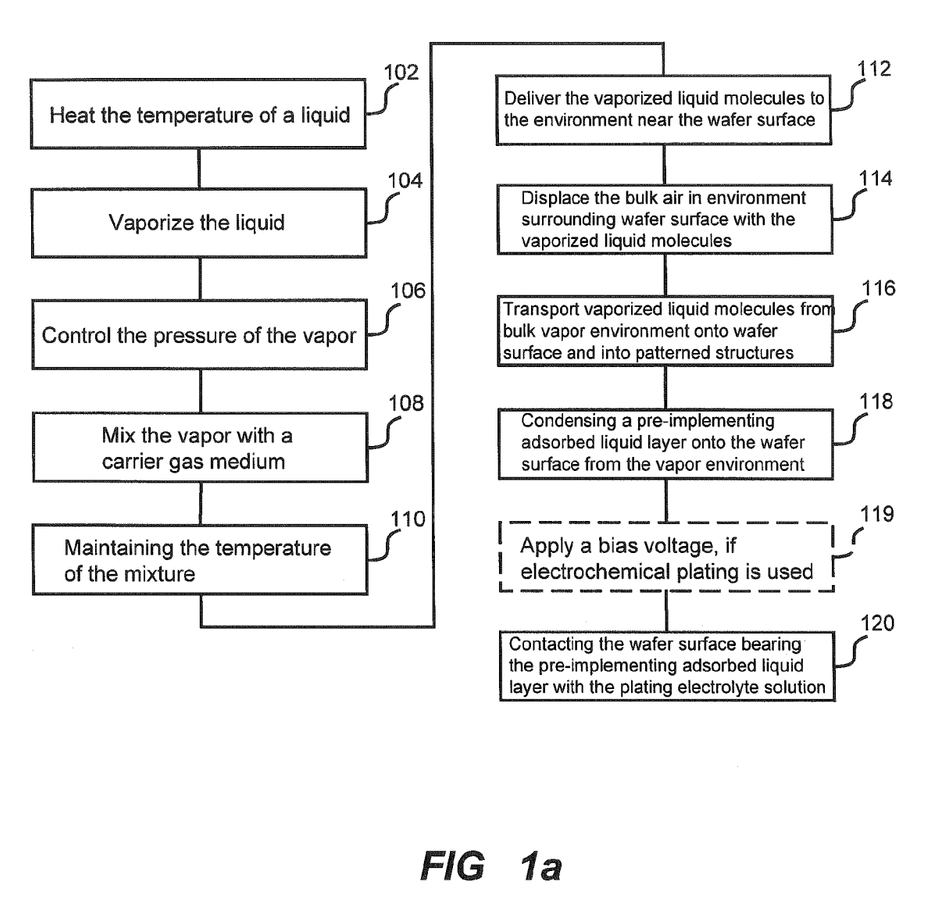
FIG. 1a is a flowchart of the wafer surface pre-wetting process according to one embodiment of the present invention.

FIG. 1a shows the process for pre-wetting wafer surface for metallization. A liquid, such as de-ionized water, which will be used to form the pre-implementing adsorbed liquid layer will be heated (as shown in step 102) to a predetermined temperature. As in one embodiment, the liquid temperature will be elevated to the range between 35° C. to 170° C. After elevating to the predetermined temperature, the liquid is then be vaporized (as shown in step 104). Vaporizing the liquid can be done by either flash evaporation or by flushing the carrier gas through the liquid. When vaporizing the liquid, the pressure of the vapor is controlled (as shown in step 106). The partial pressure of the vaporized liquid is monitored by a sensor. Before the liquid molecules is delivered to the surface of the wafer, the vapor containing the liquid molecules will be mixed with a carrier gas medium, such as air, N2, He, and Ar (as shown in step 108). While mixing the liquid molecules with the carrier gas medium, the temperature of the obtained mixture is maintained at a predetermined range (as shown in step 110), so that the pre-implementing adsorbed liquid layer formed at elevated temperature will have lower surface tension than that formed at room temperature. In the next steps vaporized liquid molecules will be transported onto the surface of the wafer, where they will condense and form a thin layer. According to FIG. 1, in step 112, the mixture of vaporized liquid molecules and carrier gas are delivered to the environment near the wafer surface. And in step 114, the bulk air in environment surrounding wafer surface is displaced with the mixture of vaporized liquid molecules and carrier gas delivered in step 112. In step 116, vaporized liquid molecules are transported from bulk vapor environment into patterned structures on the surface of the wafer. In one embodiment, transporting of the vaporized liquid molecules into the patterned features of vias, trenches and dual damascenes on the wafer surface is realized by a combination of gas phase convection and diffusion. Then, in step 118, a pre-implementing liquid layer is formed on the entire wafer front surface by multiplayer adsorption of the vaporized liquid molecules from the vapor environment. In one embodiment, condensing of the vaporized liquid molecules can be done selectively when the wafer surface having partitions of different free surface energy, and the selective condensation of the pre-implementing adsorbed liquid layer on surfaces with higher surface energy triggers selective nucleation in the subsequent metallization process. The thickness of the pre-implementing adsorbed liquid layer is typically on the scale of nanometers, orders of magnitude thinner than the pre-wetting liquid layer formed hydrodynamically by rinse and spin, which is used in prior art, whose thickness is usually in the range of tens of micrometers. In one embodiment, the thickness of the pre-implementing adsorbed liquid layer formed by multilayer adsorption of the vaporized molecules on the wafer surface is controlled by a plurality of factors, such as: the content of the vaporized liquid molecules in the environment surrounding the wafer surface, the temperature difference between the vapor and the wafer surface, the surface energy, and the heat of adsorption. In one embodiment, when the temperature difference between the vapor and the wafer surface is not significantly large, the thickness of the adsorbed liquid layer can be closely modeled by BET multilayer adsorption isotherm. Also, the content of the vaporized liquid molecules in the environment surrounding the wafer surface is adjusted by the partial pressure of the vapor in the mixture. The last step, as shown in step 120, the wafer surface bearing the pre-implementing adsorbed liquid layer will be contacted with the plating electrolyte solution. In one embodiment, a bias voltage may be applied to the wafer surface prior to contacting with the electrolyte solution, as shown by an optional step 119, if a electrochemical plating process is used, the optional step 119 of applying a bias voltage is provided before the step 120, otherwise, the step 119 can be omitted. Since the pre-implementing adsorbed layer is very thin, when contacting the wafer surface with the electrolyte solution, dilution from such a thin adsorbed liquid layer to bulk plating electrolyte is minimal even at a high volume setting. For example, the global electrolyte dilution percentage from a 2 nanometer thick adsorbed liquid film is 5,000 times less than a 10 micrometer thick liquid film formed hydrodynamically.

Figure 1B:
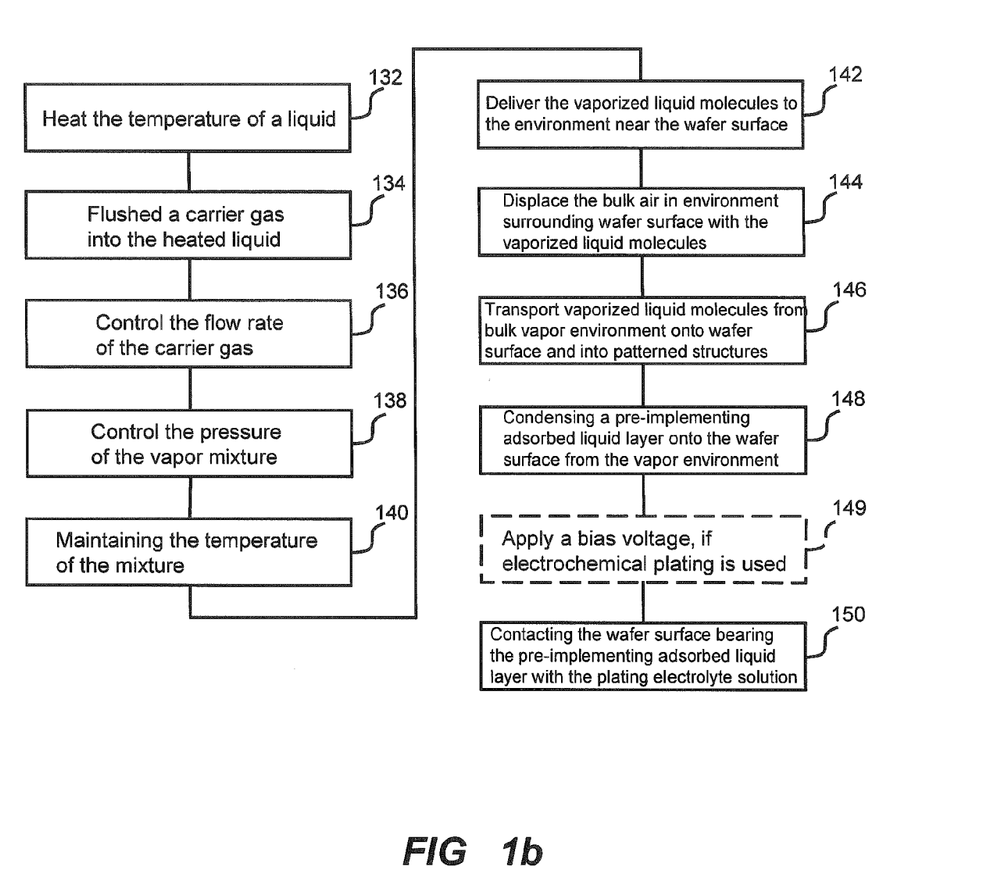
FIG. 1b is a flowchart of the wafer surface pre-wetting process according to another embodiment of the present invention.

FIG. 1b shows an alternative process for pre-wetting wafer surface for metallization, which uses a different method to vaporize a liquid. In step 132, a liquid, such as de-ionized water is heated. Then in step 134, a carrier gas, such as air, N2, He, and Ar, is flushed into the heated liquid, then the vapor of the liquid is mixed with the carrier gas to form a vapor mixture. In step 136, the flow rate of the carrier gas is controlled so as to adjust the throughput of the vapor mixture. The pressure of the vapor mixture is controlled (as shown in step 138). For steps 140-150, is the same as the steps 110-120 as mentioned above. That means, in step 140, the temperature of the mixture is maintained. In step 142, the vaporized liquid molecules are delivered to the environment near the wafer surface. In step 144, the bulk air in environment surrounding wafer surface is displaced with the vaporized liquid molecules. In step 146, vaporized liquid molecules are transported from bulk vapor environment onto wafer surface and into patterned structures. In step 148, a pre-implementing adsorbed liquid layer is condensed onto the wafer surface from the vapor environment. In step 150, the wafer surface bearing the pre-implementing adsorbed liquid layer is contacted with the plating electrolyte solution. An optional step 149 is also provided, when electrochemical plating process is used, a bias voltage will be applied. In other embodiment, the step of vaporizing a liquid can be realized by other methods, such as flash evaporation.

The pre-wetting process can be applied to pre-wetting the surface for metallization step from electrolyte solutions in semiconductor device interconnection formation, or fabricating electrical contacts including bump and through silicon via formation for packaging semiconductor devices. According to the different metal ions contained in the electrolytes for different metallization steps, for example, the electrolytes may contain Cu, Au, Ag, Ni, Ru and Co ions for semiconductor device interconnection formation and may contain Cu, Au, Ni, Sn, Pt, and Ag ions for packaging semiconductor devices; the liquid can be different materials. The pre-implementing adsorbed liquid layer on the wafer surface formed by the liquid molecules should be wettable by and miscible with the plating electrolyte solution.

Figure 2:
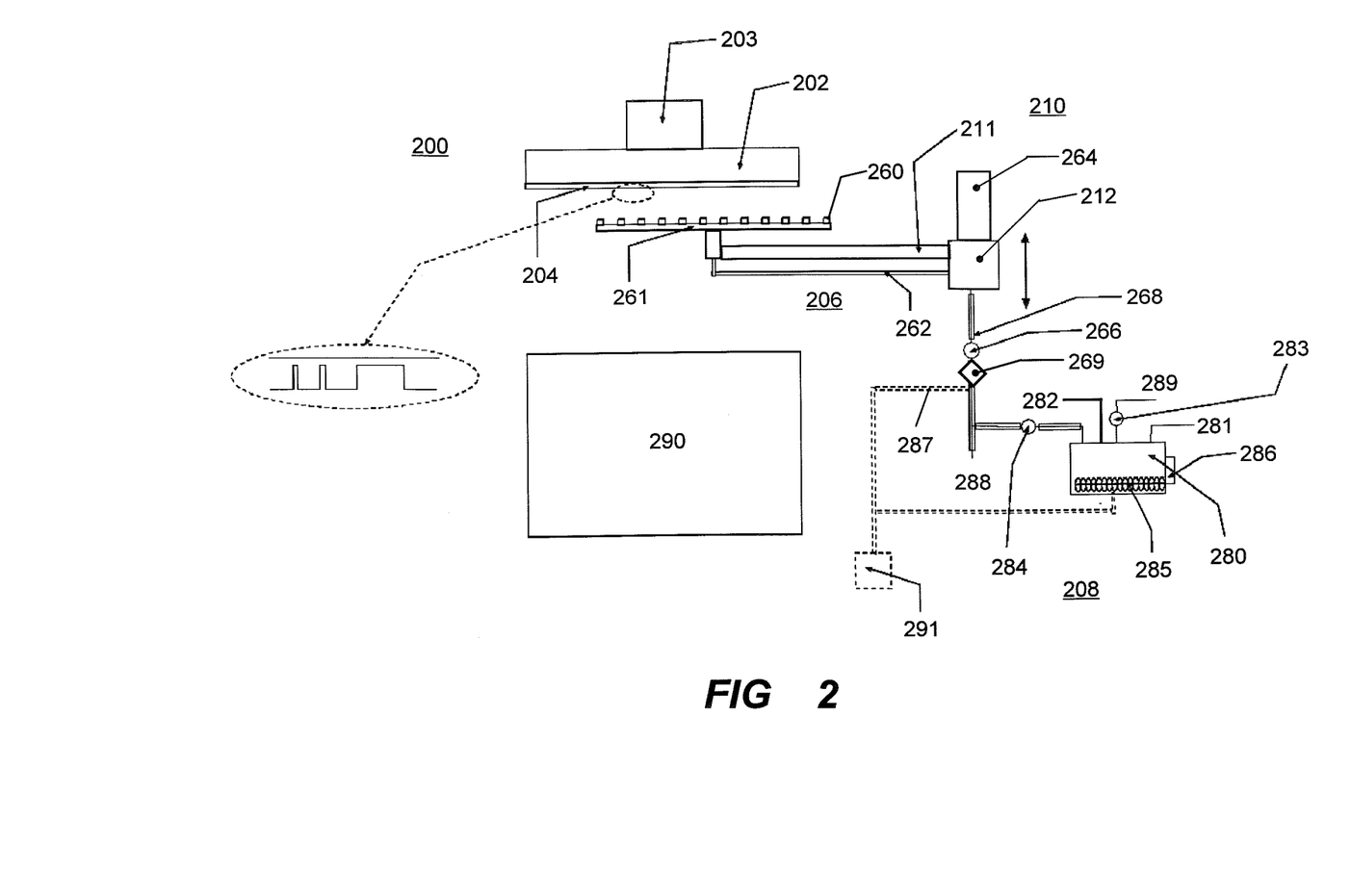
FIG. 2 is a schematic view of the wafer surface pre-wetting apparatus according to one embodiment of the present invention.

FIG. 2 shows an apparatus for implementing the pre-wetting process mentioned above. The apparatus 200 comprises: a substrate holding device 202 for holding a substrate 204 having one or more features formed thereon. An established layer of metal also covers at least part of the surface of the substrate 204. In one embodiment, the substrate holding device 202 is put in rotational motion by a motor 203. A vapor delivery device 206 sprays vapor that contains at least one type of the molecules to be condensed into a thin pre-implementing adsorbed liquid layer on the substrate surface. As shown in FIG. 2, the vapor delivery device 206 consists of a nozzle or a set of nozzles 260, a tube 262, a position fixer 264, a pressure regulator 266, an insulating wall 268 and a filter 269. The filter 269 is provided before the pressure regulator 266 and insulating wall 268 provides insulation. A mechanical system 210 is also provides, the mechanical system 210 is composed of an actuator 212 and a connect arm 211, which controls the relative motion between the vapor delivery device 206 and the substrate 204. The nozzle 260 is positioned in proximity to the surface of the substrate 204, the nozzle 260 can be either housed in an independent process module or integrated onto an existing processing module, such as the plating module (for example, the discharging plate 261). The thin pre-implementing adsorbed liquid layer can also be formed during wafer transfer by integrating the nozzle 260 onto a wafer transfer robot. In one embodiment, the nozzle 260 can be stationary or put in motion relative to the substrate by an actuator. Continue to see FIG. 2, the apparatus 200 further comprises a vapor generation device 208 that converts part of the liquid into vapor. As shown in FIG. 2, the vapor generation device 208 consists of a vessel 280, a liquid inlet 281, an outlet 282, a pressure release valve 283, a throttle valve 284, a heater 285, a pressure-temperature control loop 286, a carrier gas inlet 287, a liquid drain 288, and an exhaust 289. Vapor is generated by heating the liquid in the vessel 280 with controlled pressure. A dry gas, such as air, N2, He, and Ar, is used as carrying medium for the vaporized liquid molecules. The dry gas is contained in a dry gas source 291. The dry gas is blown into the liquid inside the vessel and exits at the outlet, carrying the vaporized liquid molecules to pass a pressure regulator before reaching the nozzle. In one embodiment, the pressure release valve 283 is set between 1 and 7 bar and the pressure-temperature control loop is set between 35° C. to 170° C. The vapor delivery lines from vapor generator to nozzles are heat-insulated. The vapor exit outlets on vapor delivery device 260 may have various orientations and size.

The above mentioned components: the set of nozzles 260, the tube 262, and the position fixer 264 can be built on an existing process module, such as be integrated to a metallization module, directly above the plating cell containing electrolyte solutions 290 as shown in FIG. 2.

In another embodiment of the present invention, a bubbles free pre-wetting method is applied for fully filling the pre-implementing adsorbed liquid into very small vias and trenches with nanometer scale.

Figure 3A:
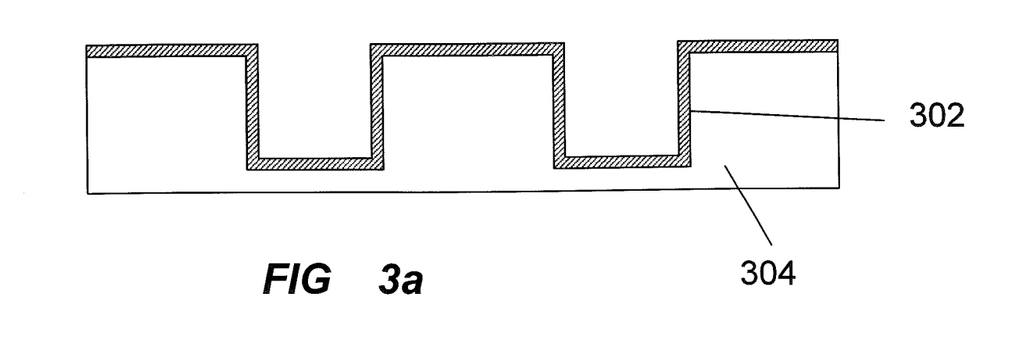
FIG. 3a is a schematic view showing pre-implementing adsorbed liquid layer consisting of at least one layer of vaporized liquid molecule condensing onto the wafer surface including patterned structures.
Figure 3B:
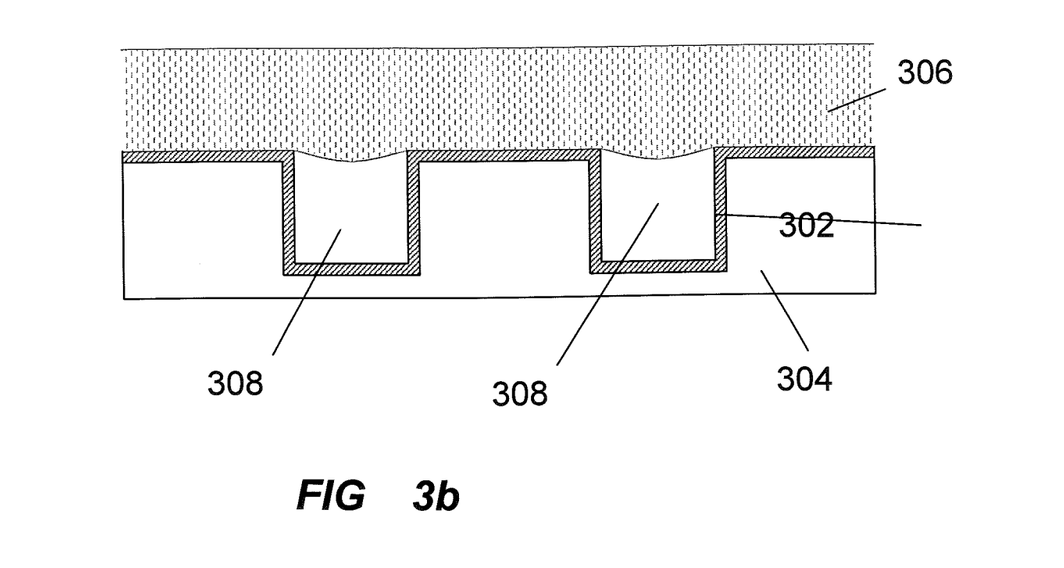
FIG. 3b is a schematic view showing bubbles generated in the patterned structures when the process solution is supplied to the wafer surface.

In the embodiments shown in FIG. 1a and FIG. 1b, there is at least one pre-implementing adsorbed liquid layer condensing onto the wafer surface including the vias and trenches, and the pre-implementing adsorbed liquid layer, consisting of at least one layer of vaporized liquid molecules, doesn't fully fill the vias and trenches, as shown in FIG. 3a. In FIG. 3a, the pre-implementing adsorbed liquid layer consisting of at least one layer of vaporized liquid molecules is marked as 302, and the wafer is marked as 304. Once the plating electrolyte solution is supplied to the wafer surface in the subsequent metallization step, the openings of the very small vias and trenches will be covered by the plating electrolyte solution and the bubbles will be formed and sealed inside the vias and trenches if the vias and trenches are not fully filled with the pre-implementing adsorbed liquid, as shown in FIG. 3b. In FIG. 3b, the plating electrolyte solution is marked as 306 and the bubbles are marked as 308. The pre-implementing adsorbed liquid layer consisting of at least one layer of vaporized liquid molecules is again marked as 302, and the wafer is again marked as 304.

Figure 4A:
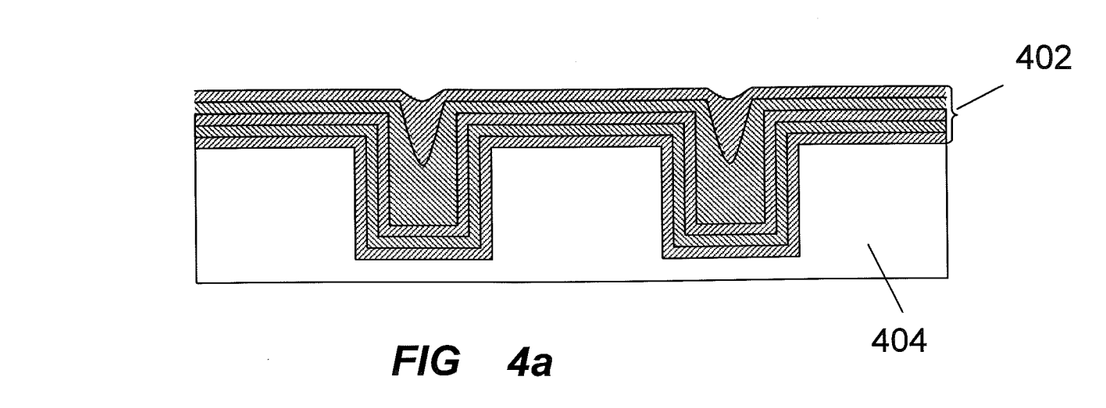
FIG. 4a is a schematic view showing the pre-implementing adsorbed liquid fully filled in the patterned structures by multilayer absorption of the vaporized liquid molecules.

In order not to generate bubbles inside the vias and trenches, the bulk pre-implementing adsorbed liquid fully fills in the vias and trenches by the multilayer absorption of vaporized liquid molecules, as shown in FIG. 4a. In FIG. 4a, the multilayer absorption of the vaporized liquid molecules is marked as 402 and the wafer is marked as 404. At the end of the process of filling, the bubbles are expelled from the vias and trenches by the surface tension of the pre-implementing adsorbed liquid. The vias and trenches on the wafer surface, with nanometer scale normally less than 500 nm opening width, or deep cavities with an aspect ratio beyond 5:1 (depth/width), can be filled by a sufficient number of the absorbed liquid molecular layers. The number of the absorbed liquid molecular layers is controlled by the partial pressure of liquid in the vapor phase, and the temperature difference between the adsorbed vaporized liquid and the adsorption surface. The temperature of the wafer surface is above the dew point of the vaporized liquid while condensing. The condensation speed in this condition is lower than the condensation speed of supersaturating under the dew point, which is beneficial to expelling the bubbles from the vias and trenches. If the temperature of the wafer surface is below the dew point, the condensation speed is too fast and the adsorbed liquid may seal the openings of the vias and trenches, probably resulting in the bubbles being sealed inside the vias and trenches.

The equation shows the parameters for controlling the number of absorbed liquid molecular layers on wafer surface:

$$n = \frac{V}{V_m} = \frac{\exp\left[T\left(\frac{\partial \ln P}{\partial T}\right)_q - E_L\right] * \frac{p}{p_s}}{\left(1 - \frac{p}{p_s}\right)\left(1 - \left\{\left[\exp\left(T\left(\frac{\partial \ln P}{\partial T}\right)_q - E_L\right)\right] - 1\right\}\frac{p}{p_s}\right)}$$

wherein, n is the number of absorbed liquid molecular layer, V is the absorbed liquid quantity, in volume units, Vm is the monolayer absorbed liquid quantity, P is the partial pressure of liquid in the vapor phase, T is the temperature of adsorbed vaporized liquid. p and ps is the equilibrium and the saturation pressure of adsorbates at the temperature of adsorption, EL is the heat of adsorption the second and higher layers of liquid molecules liquefaction.

Figure 5:
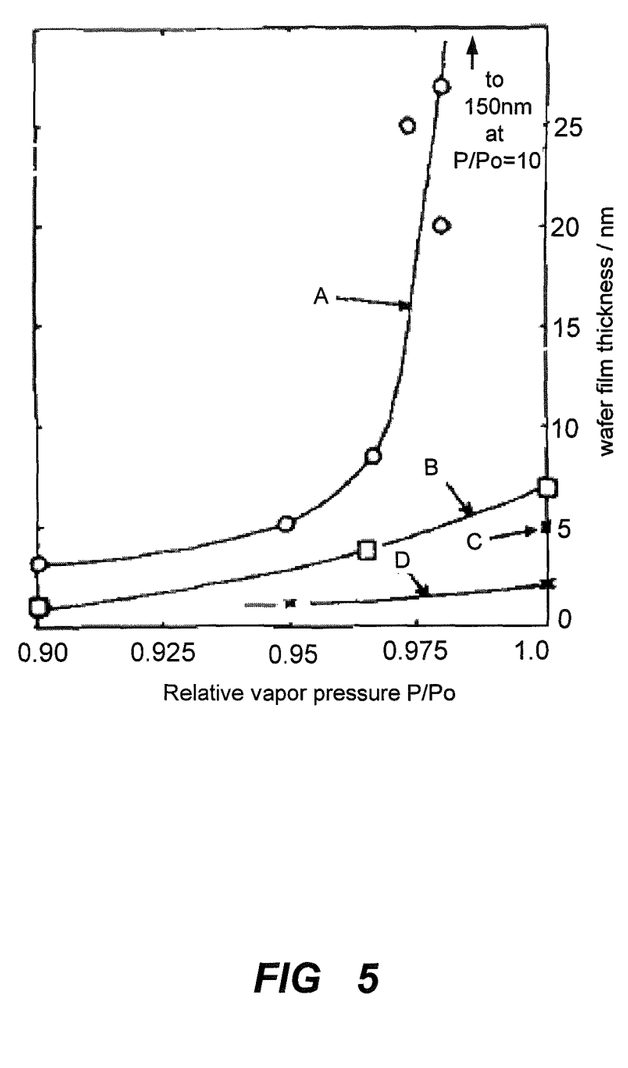
FIG. 5 is a graph showing the relationship between the relative vapor pressure and the water film thickness.

FIG. 5 shows the thickness of a water film formed on a crystal quartz surface and the water film ranges from 5 nanometers to 150 nanometers when the partial pressure of water in the vapor phase is from 90% to 99% of its saturation pressure at a temperature of 25° C. It predicts that a via or trench with an opening width less than 300 nm can be filled with bulk liquid and without bubbles inside the via or trench only by the method of controlling the partial pressure of the vaporized liquid. Increasing the difference between the vaporized liquid and the absorption surface, the thickness of the liquid film formed on the wafer surface can further be increased, so that wider vias and trenches can be filled without bubbles. In FIG. 5, curves A-D indicate surfaces with different materials.

Figure 4B:
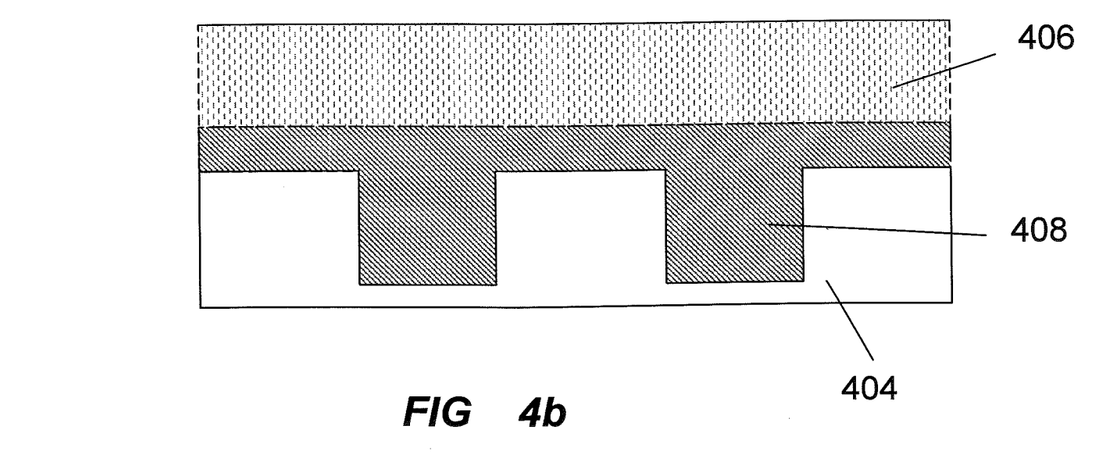
FIG. 4b is a schematic view showing the process solution contacting the wafer surface bearing the pre-implementing adsorbed liquid layer.

In a bubbles-free pre-wetting case, once the plating electrolyte solution is supplied to the wafer surface in the subsequent metallization step, the plating electrolyte solution contacts the pre-wetting liquid directly, as shown in FIG. 4b. In FIG. 4b, the plating electrolyte solution is marked as 406, the pre-wetting liquid is marked as 408 and the wafer is marked as 404. Due to this bubbles-free pre-wetting method, the plating electrolyte solution, which is miscible with the pre-wetting liquid in the subsequent metallization step, can diffuse into the vias and trenches without being blocked by bubbles inside the vias and trenches. In this case, void-free and bottom-up gapfill in the vias and trenches with small features and deep cavities is achieved by the metal salts electrolytes with organic additives accessing into the vias and trenches with small features and deep cavities in the subsequent metallization step. Without the void formation inside the vias and trenches in the metallization step, device reliability failure is avoided.

This method also can be applied to the pre-wetting step before cleaning or wet etch process in small features and deep cavities on the wafer surface. When the features of vias and trenches decreases to nanometer scales, such as less than 500 nm opening width, or their cavities aspect ratio increases to beyond 5:1 (depth/width), the bubbles are easily formed and sealed inside the vias and trenches if the vias and trenches are not fully filled with the pre-implementing adsorbed liquid. However, with the bubbles free pre-wetting method, the process solution, such as cleaning solution or wet etch solution which is miscible with the pre-wetting liquid in the subsequent cleaning or wet etch step, can diffuse into the vias and trenches without being blocked by the bubbles inside the vias and trenches. In an embodiment of a bubbles free pre-wetting step for semiconductor substrate cleaning process, the impurities, such as polymers, PR residues and particles, can be solved or removed out by cleaning solution thoroughly accessing into the vias and trenches with small features and deep cavities in the subsequent cleaning step. Without being blocked by the bubbles, the enough amounts of cleaning solution diffuse into the vias and trenches in a set time, so that the cleaning performance and productivity are further enhanced. In an embodiment of a bubbles free pre-wetting step for semiconductor substrate wet etch process, the inside surfaces of small features and deep cavities can be etched by etchants thoroughly accessing into the vias and trenches with small features and deep cavities in the subsequent wet etch step. Without being blocked by the bubbles, the enough amounts of etchants diffuse into the vias and trenches in a set time, so that the etching performance and productivity are further enhanced.

As described above, based on the pre-wetting method of the present invention, a surface layer of pre-wetting liquid of nanometer thickness can be formed on the wafer surface or the pre-wetting liquid fully fills the vias and trenches without bubbles. The temperature of the wafer surface is without the requirement of controlling the temperature of the wafer surface bellow the dew point of the vaporized liquid.

The invention claimed is:

1. A method for pre-wetting a wafer surface having patterned structures, comprising:
vaporizing a liquid to form vaporized liquid molecules;
delivering the vaporized liquid molecules to an environment near a wafer surface;
displacing bulk air in the environment near the wafer surface with the vaporized liquid molecules and transporting the vaporized liquid molecules onto the wafer surface and into patterned structures;
adsorbing the vaporized liquid molecules onto the wafer surface to form a pre-implementing adsorbed liquid layer on the wafer surface and in the patterned structures, while maintaining a temperature of the wafer surface above a dew point of the vaporized liquid, wherein the pre-implementing adsorbed liquid layer fully fills the patterned structures by multilayer absorption of the vaporized liquid molecules; and
contacting the wafer surface bearing the pre-implementing adsorbed liquid layer with a processing solution.

2. The method of claim 1, wherein the patterned structures have an opening width of less than 500 nm, and a depth/width aspect ratio of greater than 5:1.

3. The method of claim 1, wherein the condensing step includes condensing the vaporized liquid molecules at a speed that is lower than the condensation speed of supersaturating under the dew point of the vaporized liquid.

4. The method of claim 1, wherein the contacting step is part of a metallization process in which the processing solution is a plating electrolyte solution, part of a cleaning process in which the processing solution is a cleaning solution, or part of a wet etch process in which the processing solution is a wet etch solution.

5. The method of claim 1, wherein the liquid that forms the pre-implementing adsorbed liquid layer on the wafer surface is wettable by the process solution.

6. The method of claim 1, wherein the liquid that forms the pre-implementing adsorbed liquid layer on the wafer surface is miscible with the process solution.

7. The method of claim 1, wherein the vaporizing step includes flash evaporation, or flushing a carrier gas through the liquid.

8. The method of claim 1, wherein the pre-implementing adsorbed liquid layer is formed on the wafer surface at a thickness controlled by the concentration of the vaporized liquid molecules in the environment surrounding the wafer surface, or by the difference between the temperature of the vapor and the temperature of the wafer surface.

* * * * *